US 11,994,542 B2

(12) United States Patent
Kapoor et al.

(10) Patent No.: US 11,994,542 B2
(45) Date of Patent: May 28, 2024

(54) RF SIGNAL PARAMETER MEASUREMENT IN AN INTEGRATED CIRCUIT FABRICATION CHAMBER

(71) Applicant: Lam Research Corporation, Fremont, CA (US)

(72) Inventors: Sunil Kapoor, Vancouver, WA (US); David French, Portland, OR (US)

(73) Assignee: Lam Research Corporation, Fremont, CA (US)

( * ) Notice: Subject to any disclaimer, the term of this patent is extended or adjusted under 35 U.S.C. 154(b) by 913 days.

(21) Appl. No.: 16/832,961

(22) Filed: Mar. 27, 2020

(65) Prior Publication Data

US 2021/0302478 A1  Sep. 30, 2021

(51) Int. Cl.
*G01R 19/25* (2006.01)
*G01R 15/16* (2006.01)
(Continued)

(52) U.S. Cl.
CPC ......... *G01R 19/2509* (2013.01); *G01R 15/16* (2013.01); *G01R 15/18* (2013.01);
(Continued)

(58) Field of Classification Search
CPC ...... H03H 7/40; G01R 29/0892; G01R 19/25; G06F 30/367; H01J 37/32935;
(Continued)

(56) References Cited

U.S. PATENT DOCUMENTS 3,995,237 A   11/1976 Brunner
4,044,357 A   8/1977  Goldie
(Continued)

FOREIGN PATENT DOCUMENTS

CN   1233147 A   10/1999
CN   1619767 A   5/2005
(Continued)

OTHER PUBLICATIONS

International Preliminary Report on Patentability dated Jan. 12, 2023, in PCT Application No. PCT/US2021/038457.
(Continued)

*Primary Examiner* — Yuechuan Yu
(74) *Attorney, Agent, or Firm* — Weaver Austin Villeneuve & Sampson LLP

(57) ABSTRACT

An apparatus to estimate parameters of a radio frequency (RF) signal may include a voltage sensor configured to provide an indication of a voltage of the RF signal as well as a current sensor configured to provide an indication of current conducted by the RF signal. The apparatus may additionally include an analog-to-digital conversion module coupled to an output port of the voltage sensor and the current sensor, wherein the analog-to-digital converter is configured to provide digital representations of an instantaneous voltage and an instantaneous current of the RF signal. The apparatus may additionally include one or more processors configured to transform the digital representations of the instantaneous voltage and current into frequency domain representations of a complex voltage and complex current.

19 Claims, 7 Drawing Sheets

(51) Int. Cl.
  *G01R 15/18* (2006.01)
  *H01J 37/32* (2006.01)
  *H01L 21/67* (2006.01)

(52) U.S. Cl.
  CPC .. *H01J 37/32183* (2013.01); *H01J 37/32899* (2013.01); *H01L 21/67161* (2013.01); *H01L 21/67253* (2013.01); *H01J 2237/24495* (2013.01); *H01J 2237/24564* (2013.01)

(58) Field of Classification Search
  CPC ........... H01J 37/32183; H01J 37/32926; H01J 2237/327; H05H 1/46; H05H 2242/26; H01P 3/00
  See application file for complete search history.

(56) References Cited

U.S. PATENT DOCUMENTS

| | | |
|---|---|---|
| 5,195,045 A | 3/1993 | Keane et al. |
| 5,314,603 A | 5/1994 | Sugiyama et al. |
| 5,369,795 A | 11/1994 | Yanagimoto |
| 5,499,384 A | 3/1996 | Lentz et al. |
| 5,572,170 A | 11/1996 | Collins et al. |
| 5,580,385 A | 12/1996 | Paranjpe et al. |
| 5,643,364 A | 7/1997 | Zhao et al. |
| 5,770,922 A | 6/1998 | Gerrish et al. |
| 5,866,985 A | 2/1999 | Coultas et al. |
| 5,897,713 A | 4/1999 | Tomioka et al. |
| 6,020,794 A | 2/2000 | Wilbur |
| 6,028,014 A | 2/2000 | Sukjarev |
| 6,054,013 A | 4/2000 | Collins et al. |
| 6,068,784 A | 5/2000 | Collins et al. |
| 6,251,792 B1 | 6/2001 | Collins et al. |
| 6,288,493 B1 | 9/2001 | Lee et al. |
| 6,388,226 B1 | 5/2002 | Smith et al. |
| 6,444,137 B1 | 9/2002 | Collins et al. |
| 6,447,636 B1 | 9/2002 | Qian et al. |
| 6,518,195 B1 | 2/2003 | Collins et al. |
| 6,815,633 B1 | 11/2004 | Chen et al. |
| 6,887,339 B1 | 5/2005 | Goodman et al. |
| 6,922,324 B1 | 7/2005 | Horwitz |
| 6,939,434 B2 | 9/2005 | Collins et al. |
| 7,042,311 B1 | 5/2006 | Hilliker et al. |
| 7,777,152 B2 | 8/2010 | Todorov et al. |
| 8,179,050 B2 | 5/2012 | Chen et al. |
| 8,190,380 B2 | 5/2012 | Choueiry et al. |
| 8,368,308 B2 | 2/2013 | Banna et al. |
| 8,617,351 B2 | 12/2013 | Hoffman et al. |
| 9,082,589 B2 | 7/2015 | Thomas et al. |
| 9,526,161 B2 | 12/2016 | Habu |
| 9,704,692 B2 | 7/2017 | Leeser |
| 9,779,196 B2 | 10/2017 | Valcore, Jr. et al. |
| 9,918,376 B2 | 3/2018 | Thomas et al. |
| 10,950,421 B2 | 3/2021 | Valcore, Jr. |
| 11,527,385 B2 | 12/2022 | Maw et al. |
| 11,756,768 B2 | 9/2023 | Hasegawa et al. |
| 2001/0042594 A1* | 11/2001 | Shamouilian ..... H01J 37/32458 118/724 |
| 2001/0054383 A1 | 12/2001 | Pu et al. |
| 2002/0023899 A1 | 2/2002 | Khater et al. |
| 2002/0180534 A1 | 12/2002 | Bohn et al. |
| 2003/0146803 A1 | 8/2003 | Pickard et al. |
| 2003/0157812 A1 | 8/2003 | Narwankar et al. |
| 2004/0032212 A1 | 2/2004 | Yuzurihara et al. |
| 2004/0195972 A1 | 10/2004 | Cornelius |
| 2005/0001556 A1 | 1/2005 | Hoffman et al. |
| 2005/0106873 A1 | 5/2005 | Hoffman et al. |
| 2005/0134186 A1 | 6/2005 | Brouk et al. |
| 2005/0205532 A1 | 9/2005 | Patrick et al. |
| 2006/0116106 A1* | 6/2006 | Turner ............. H01J 37/32174 455/410 |
| 2007/0153780 A1* | 7/2007 | Stanley .................. G01R 19/25 370/360 |
| 2007/0251920 A1 | 11/2007 | Hoffman |
| 2008/0106206 A1 | 5/2008 | Hooke et al. |
| 2009/0278512 A1 | 11/2009 | Karlicek et al. |
| 2009/0289630 A1 | 11/2009 | Nascimento et al. |
| 2010/0025384 A1 | 2/2010 | Todorow et al. |
| 2010/0171427 A1 | 7/2010 | Kirchmeier et al. |
| 2011/0063042 A1 | 3/2011 | Mendolia et al. |
| 2011/0101862 A1 | 5/2011 | Koo et al. |
| 2011/0140607 A1 | 6/2011 | Moore et al. |
| 2011/0148303 A1 | 6/2011 | Van Zyl et al. |
| 2011/0214811 A1 | 9/2011 | Ashida |
| 2012/0074844 A1 | 3/2012 | York et al. |
| 2012/0212135 A1 | 8/2012 | Suzuki |
| 2012/0247679 A1 | 10/2012 | Yamazawa |
| 2012/0298303 A1 | 11/2012 | Ikeda et al. |
| 2013/0105082 A1 | 5/2013 | Melikyan et al. |
| 2013/0234741 A1 | 9/2013 | Mow et al. |
| 2014/0008357 A1 | 1/2014 | Cheng et al. |
| 2014/0062303 A1 | 3/2014 | Hoffman et al. |
| 2014/0087668 A1 | 3/2014 | Mow et al. |
| 2014/0097751 A1 | 4/2014 | Thomas et al. |
| 2014/0155008 A1 | 6/2014 | Van Zyl |
| 2015/0221478 A1 | 8/2015 | Himori et al. |
| 2015/0313000 A1 | 10/2015 | Thomas et al. |
| 2015/0340204 A1 | 11/2015 | Kudela et al. |
| 2015/0348854 A1 | 12/2015 | Kapoor et al. |
| 2016/0065207 A1 | 3/2016 | Bhutta |
| 2016/0113103 A1* | 4/2016 | Van Zyl ................... H05H 1/46 315/111.21 |
| 2017/0117869 A1 | 4/2017 | Leeser et al. |
| 2017/0330732 A1 | 11/2017 | Valcore, Jr. et al. |
| 2017/0330744 A1 | 11/2017 | Keil et al. |
| 2017/0345620 A1 | 11/2017 | Coumou et al. |
| 2017/0365907 A1 | 12/2017 | Kapoor et al. |
| 2017/0372870 A1 | 12/2017 | Godyak et al. |
| 2018/0023158 A1 | 1/2018 | Sasaki et al. |
| 2018/0068834 A1 | 3/2018 | Valcore, Jr. et al. |
| 2018/0097520 A1 | 4/2018 | Wu |
| 2018/0163302 A1 | 6/2018 | Kapoor et al. |
| 2018/0231587 A1 | 8/2018 | Ye et al. |
| 2018/0261431 A1 | 9/2018 | Hammond, IV et al. |
| 2018/0351322 A1 | 12/2018 | Kurosawa et al. |
| 2018/0366378 A1 | 12/2018 | Kim et al. |
| 2019/0068158 A1 | 2/2019 | Coumou et al. |
| 2019/0108979 A1 | 4/2019 | Higuchi |
| 2019/0149119 A1 | 5/2019 | Kapoor et al. |
| 2019/0288737 A1 | 9/2019 | Hanks et al. |
| 2020/0010957 A1 | 1/2020 | Chen et al. |
| 2020/0126762 A1 | 4/2020 | Yang et al. |
| 2021/0313948 A1 | 10/2021 | Leeser et al. |
| 2022/0190854 A1 | 6/2022 | Juco et al. |
| 2022/0328236 A1 | 10/2022 | Kapoor |
| 2022/0344129 A1 | 10/2022 | Kapoor |
| 2022/0375721 A1 | 11/2022 | Fields et al. |
| 2022/0415616 A1 | 12/2022 | Juco et al. |
| 2023/0052543 A1 | 2/2023 | Linebarger, Jr. et al. |
| 2023/0223238 A1 | 7/2023 | Guo et al. |
| 2023/0326720 A1 | 10/2023 | Mopidevi et al. |
| 2023/0341448 A1 | 10/2023 | Saurabh et al. |

FOREIGN PATENT DOCUMENTS

| | | |
|---|---|---|
| CN | 1656593 A | 8/2005 |
| CN | 1925322 A | 3/2007 |
| CN | 101630624 A | 1/2010 |
| CN | 101866808 A | 10/2010 |
| CN | 102037789 A | 4/2011 |
| CN | 103533690 A | 1/2014 |
| CN | 105321792 A | 2/2016 |
| CN | 109659215 A | 4/2019 |
| EP | 0935406 A2 | 8/1999 |
| GB | 1599557 A | 10/1981 |
| JP | H08274067 A | 10/1996 |
| JP | 2001057360 A | 2/2001 |
| JP | 2003302431 A | 10/2003 |
| JP | 2006019716 A | 1/2006 |
| JP | 4352562 B2 | 10/2009 |
| JP | 2014142266 A | 8/2014 |
| JP | 2019133785 A | 8/2019 |
| KR | 980012069 A | 4/1998 |

(56) References Cited

FOREIGN PATENT DOCUMENTS

| | | | |
|---|---|---|---|
| KR | 20010015590 A | 2/2001 | |
| KR | 20040084477 A | 10/2004 | |
| KR | 20070101654 A | 10/2007 | |
| KR | 20070109275 A | 11/2007 | |
| KR | 20110116939 A | 10/2011 | |
| KR | 101791706 B1 | 10/2017 | |
| KR | 20180080631 A | 7/2018 | |
| KR | 20190047404 A | 5/2019 | |
| KR | 20190109559 A | 9/2019 | |
| KR | 20200003561 A | 1/2020 | |
| KR | 20200111233 A | 9/2020 | |
| KR | 102505150 B1 | 2/2023 | |
| TW | I290331 B | 11/2007 | |
| TW | 201141317 A1 | 11/2011 | |
| WO | WO9914855 A1 | 3/1990 | |
| WO | WO-9534945 A2 | 12/1995 | |
| WO | WO-2009099486 A1 | 8/2009 | |
| WO | WO-2011028600 A2 | 3/2011 | |
| WO | WO-2018228133 A1 | 12/2018 | |
| WO | WO-2019079325 A1 | 4/2019 | |

OTHER PUBLICATIONS

International Preliminary Report on Patentability and written opinion dated Aug. 25, 2022 in Application PCT/US2021/017227.
International Preliminary Report on Patentability and written opinion dated Nov. 17, 2022 in Application PCT/US2021/030177.
International Preliminary Report on Patentability dated Apr. 14, 2022 from PCT/US2020/053014.
International Preliminary Report on Patentability dated Dec. 22, 2022, in PCT Application No. PCT/US2021/036163.
International Preliminary Report on Patentability dated Feb. 10, 2022 issued in Application No. PCT/US2020/070333.
International Preliminary Report on Patentability dated Jun. 16, 2022, in PCT Application No. PCT/US2020/062924.
International Preliminary Report on Patentability dated Nov. 18, 2021, issued inPCT/US2020/030835.
International Preliminary Report on Patentability dated Oct. 6, 2022 in PCT Application PCT/US2021/023942.
International Search Report and Written Opinion dated Apr. 7, 2021 issued in Application No. PCT/US2020/062924.
International Search Report and Written Opinion dated Aug. 17, 2021 issued in Application No. PCT/US2021/030177.
International Search Report and Written Opinion dated Dec. 16, 2022 in PCT Application No. PCT/US2022/030252.
International Search Report and Written Opinion dated Feb. 3, 2021 issued in Application No. PCT/US2020/057020.
International Search Report and Written Opinion dated Jan. 19, 2021, for International Application No. PCT/US2020/053014.
International Search Report and Written Opinion dated Jul. 15, 2021 issued in Application No. PCT/US2021/023942.
International Search Report and Written Opinion dated Jun. 4, 2021 issued in Application No. PCT/US2021/017227.
International Search Report and Written Opinion dated Nov. 11, 2020 issued in Application No. PCT/US2020/070333.
International Search Report and Written Opinion dated Oct. 14, 2021, in application No. PCT/US2021/038457.
International Search Report and Written Opinion dated Sep. 27, 2021 issued in Application No. PCT/US2021/036163.
KR Office Action dated Aug. 4, 2022 in Application No. KR10-2022-7013719 With English translation.
KR Office Action dated Feb. 24, 2023 in Application No. KR10-2022-7025826 with English translation.
KR Office Action dated Sep. 21, 2022 in Application No. KR10-2022-7025826 with English translation.
PCT International Preliminary Report on Patentability dated May 5, 2022 issued in PCT/US2020/057020.
U.S. Appl. No. 17/907,067, inventors Kapoor et al., filed Sep. 22, 2022.
U.S. Appl. No. 17/997,802, inventor Guo et al., filed Nov. 2, 2022.
U.S. Appl. No. 18/002,733, inventors Saurabh et al., filed Dec. 21, 2022.
Notice of Allowance dated Mar. 31, 2015 issued in U.S. Appl. No. 13/648,183.
Office Action dated Sep. 23, 2016 issued in U.S. Appl. No. 14/737,377.
Final Office Action dated Jul. 7, 2017 issued in U.S. Appl. No. 14/737,377.
Notice of Allowance dated Oct. 31, 2017 issued in U.S. Appl. No. 14/737,377.
Chinese First Office Action dated Aug. 27, 2015 issued in Application No. CN 201310467492.0.
International Search Report and Written Opinion dated Aug. 21, 2020 issued in Application No. PCT/US2020/030835.
Chinese First Office Action dated May 17, 2017 issued in Application No. CN 201610428220.3.
Chinese Second Office Action dated Mar. 5, 2018 issued in Application No. CN 201610428220.3.
Chinese Third Office Action dated Aug. 15, 2018 issued in Application No. CN 201610428220.3.
Korean Decision for Grant of Patent dated Jan. 18, 2020 issued in Application No. KR 10-2013-0120518.
Taiwanese Notice of Allowance dated Jan. 19, 2017 issued in Application No. TW 102136597.
CN Office Action dated Oct. 11, 2023, in application No. CN202080056165.4 with English translation.
CN Office Action dated Oct. 24, 2023, in application No. CN202080034447.4 with English translation.
SG Search Report and Written Opinion dated Nov. 1, 2023 in SG Application No. 11202111969R.
SG Search Report and Written Opinion dated Nov. 15, 2023 in SG Application No. 11202202918X.
U.S. Non-Final Office Action dated Dec. 21, 2023 in U.S. Appl. No. 17/594,906.
U.S. Notice of Allowance dated Jan. 12, 2024 in U.S. Appl. No. 17/756,058.
KR Office Action dated Jan. 16, 2024 in KR Application No. 10-2023-7006703 with English translation.
U.S. Notice of Allowance dated Jan. 23, 2024 in U.S. Appl. No. 17/756,058.

* cited by examiner

RF SIGNAL PARAMETER MEASUREMENT IN AN INTEGRATED CIRCUIT FABRICATION CHAMBER

BACKGROUND

Fabrication of integrated circuit devices may involve the processing of semiconductor wafers in a semiconductor processing chamber. Typical processes may involve deposition, in which a semiconductor structure may be built on or over a substrate such as by way of a layer-by-layer process. Typical processes may also involve removal (e.g., etching) of material from certain regions of the semiconductor wafer. In commercial-scale manufacturing processes, each wafer contains many copies of a set of semiconductor devices, and many wafers may be utilized to achieve the required volumes of semiconductor devices. Accordingly, the commercial viability of a semiconductor processing operation may depend, at least to some extent, upon within-wafer uniformity and upon wafer-to-wafer repeatability of process conditions. Consequently, efforts are made to ensure that each portion of a given wafer, as well as each wafer processed in a semiconductor processing chamber, is subjected to tightly-controlled processing conditions. Variations in processing conditions can bring about undesirable variations in deposition and etch rates, which, in turn, may bring about unacceptable variations in overall fabrication processes. Such variations may degrade circuit performance which, in turn, may give rise to unacceptable variations in performance of higher-level systems that utilize the integrated circuit devices. Accordingly, techniques for monitoring semiconductor processes with increased granularity, as well as an ability to make fine adjustments to process variables during fabrication, continues to be an active area of investigation.

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

In one embodiment and apparatus is utilized to estimate parameters of a radio frequency (RF) signal coupled to an integrated circuit fabrication chamber. The apparatus may include a voltage sensor configured to provide an indication of a voltage of the RF signal. The apparatus also includes a current sensor configured to provide an indication of a current conducted by the RF signal. The apparatus also includes an analog-to-digital conversion module coupled to an output port of the voltage sensor and to an output port of the current sensor, the analog-to-digital converter is configured to provide digital representations of an instantaneous voltage and an instantaneous current of the RF signal. The apparatus also includes one or more processors configured to transform the digital representations of the instantaneous voltage and the digital representations of the instantaneous current into frequency domain representations of a complex voltage corresponding to the RF signal voltage and into frequency domain representations of a complex current corresponding to the RF signal current. The one or more processors are additionally configured to combine frequency domain representations of a complex voltage and the complex current.

In other implementations, the one or more processors of the apparatus are configured to perform a Fast Fourier Transforms (FFT) of the digital representation of the instantaneous voltage of the RF signal and of the instantaneous current of the RF signal. In another implementation, the voltage sensor of the apparatus includes a capacitive voltage sensor. In another implementation, the current sensor includes an inductive current transformer. In an implementation, the analog-to-digital conversion module is configured to apply a successive-approximation technique. In another implementation, the RF signal is provided by an RF power generator, which provides at least 2 frequency components. In an implementation, the at least 2 frequency components include a first component having a frequency of about 400 kHz and a second component having a frequency of about 13.56 MHz. In an implementation, the one or more processors of the apparatus are additionally configured to apply one or more calibration coefficients to the frequency domain representations of the complex voltage and to apply one or more calibration coefficients to the frequency domain representations of the complex current. In an implementation, the one or more processors are additionally configured to aggregate the complex voltage and the complex current to form root mean square voltage and rms current. In an implementation, the apparatus is exclusive of a voltage divider. In an implementation, the apparatus is exclusive of a peak detector. In an implementation, apparatus is exclusive of a buffer amplifier. In an implementation, the frequency domain representations of the complex voltage and the complex current are combined to obtain actual power delivered to a process station. In an implementation, the frequency domain representations of the complex voltage and the complex current are combined to obtain power factor at the process station.

In another embodiment an apparatus may be adapted or configured to estimate radio frequency (RF) power coupled to a station of an integrated circuit fabrication chamber. The apparatus may include a voltage sensor configured to provide an indication of a voltage of the RF signal. The apparatus also includes a current sensor configured to provide an indication of the current conducted by the RF signal. The apparatus also includes an analog-to-digital conversion module coupled to an output port of the voltage sensor and to an output port of the current sensor, the analog-to-digital converter configured to provide digital representations of an instantaneous voltage and an instantaneous current of the RF signal. The apparatus may include one or more processors configured to obtain the digital representations of the instantaneous voltage of the RF signal and the digital representations of the instantaneous current conducted by the RF signal. The one or more processes may transform the obtained digital representations of the instantaneous voltage of the RF signal and the obtained instantaneous current of the RF signal into frequency domain representations of a complex voltage corresponding to the voltage of the RF signal and into frequency domain representation of a complex current corresponding to the current conducted by the RF signal. In an implementation, the apparatus is additionally configured to combine the complex voltage of the RF signal and the complex current of the RF signal.

In an implementation, the one or more processors of the apparatus is configured to transform the obtained digital representations of the instantaneous voltage of the RF signal and the instantaneous current conducted by the RF signal utilizing a Fast Fourier Transform. In an implementation, the one or more processors of the apparatus is additionally configured to apply one or more calibration coefficients to the complex voltage of the RF signal and the complex current conducted by the RF signal. In an implementation, the one or more processors of the apparatus is additionally configured to aggregate the complex voltage of the RF signal and the complex current of the RF signal to form root mean square voltage and root mean square current. In an implementation, the one or more processors of the apparatus is additionally configured to utilize the complex voltage of the RF signal and the complex current of the RF signal to obtain power delivered to a station of the integrated circuit fabrication chamber. In an implementation, the one or more processors of the apparatus is additionally configured to utilize the complex voltage of the RF signal and the complex current of the RF signal to obtain a ratio of power delivered to forward power at the station of the integrated circuit fabrication chamber. In an implementation, the apparatus is exclusive of a buffer amplifier.

In an implementation, an integrated circuit fabrication chamber, includes a radio frequency (RF) signal generator configured to couple an RF signal to the integrated circuit fabrication chamber. The integrated circuit fabrication chamber also includes a first sensor configured to sense voltage of the RF signal. The integrated circuit fabrication chamber also includes a second sensor configured to sense current conducted via the RF signal. The integrated circuit fabrication chamber also includes one or more analog-to-digital converters coupled to an output port of the first sensor and to an output port of the second sensor, the one or more analog-to-digital converters configured to convert sensed voltages and currents to digital representations. The integrated circuit fabrication chamber also includes one or more processors configured to transform the digital representations to frequency domain representations of the complex voltage of the RF signal and to transform the digital representations to frequency domain representations of the complex current conducted via the RF signal, the one or more processors additionally configured to combine the complex voltage of the RF signal and the complex current of the RF signal.

In an implementation, the integrated circuit fabrication chamber is configured to perform Fast Fourier Transform of the digital representation of the instantaneous voltage of the RF signal and of the instantaneous current conducted via the RF signal. In an implementation, the RF signal generator of the integrated circuit fabrication chamber is configured to provide 2 or more frequency components to the integrated circuit fabrication chamber. In an implementation, the integrated circuit fabrication chamber receives 2 or more frequency components including a signal below about 2 MHz a signal above about 2 MHz. In an implementation, the integrated circuit fabrication chamber includes 2 or more process stations. In an implementation, the integrated circuit fabrication chamber includes 4 process stations. In an implementation, the integrated circuit fabrication chamber is exclusive of a peak detector. In an implementation, the integrated circuit fabrication chamber is exclusive of a buffer amplifier.

DETAILED DESCRIPTION

Figure 1A:
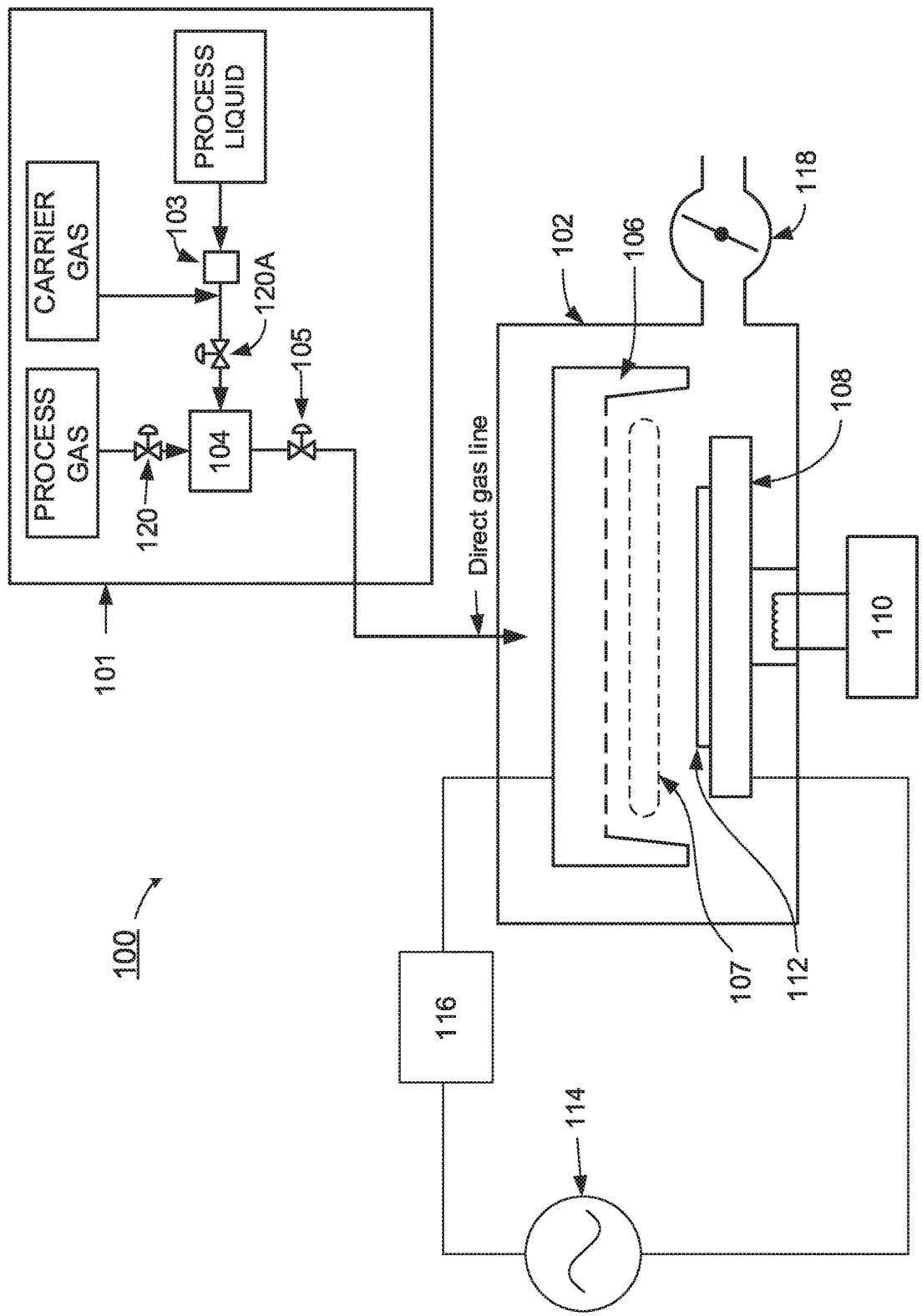
FIG. 1A shows a substrate processing apparatus for depositing or etching a film on or over a semiconductor substrate utilizing any number of processes, according to various implementations.

In particular implementations, such as implementations related to plasma-enhanced or plasma-assisted integrated circuit manufacturing processes, one or more high-power RF signals may be utilized to form an ionized plasma material. Formation of an ionized plasma material may enable precursor gases to undergo appropriate chemical reactions, which result in deposition or removal of semiconductor material from a wafer undergoing processing. Accordingly, accurate determination of RF signal parameters, such as RF voltage, RF current, as well as phase relationships between RF current and voltage, may be useful in determining RF power delivered, RF power reflected, for example, which may be utilized to exercise control over various semiconductor processes. Such processes may include deposition of a semiconductor material on or over a substrate as well as removal (e.g., etching) of material at one or more locations of the wafer. For example, in certain plasma-mediated semiconductor processes, accurate control over RF signal parameters may permit control over rates of material deposition or removal, deposition or etch uniformity across a wafer, stress introduced by deposited materials, and so forth.

In a multi-station integrated circuit fabrication chamber, in which multiple semiconductor wafers simultaneously undergo deposition or etching processes, measurement of RF signal parameters utilized in the formation of plasma may enhance uniformity of processes among various stations of the multi-station fabrication chamber. In such processing environments, in response to conditions within an individual station of a fabrication chamber resulting in changes to input impedance of the individual station, component values of an RF matching network may be adjusted so as to reduce variations in RF power coupled to the individual stations. Such precise adjustment of component values of the impedance matching network may enable coupling of a specific quantity of power into the fabrication chamber while minimizing power reflected from the fabrication chamber. Consequently, semiconductor processes conducted within a multi-station fabrication chamber may be performed with greater accuracy, which may, in turn, result in lower defect ratios and higher yields of devices formed utilizing the fabrication chamber.

In certain implementations, accurate determination of parameters of a signal from an RF power generator may allow characterization of current and voltage waveforms that may be prone to bringing about undesirable or abnormal operation of an integrated circuit fabrication chamber. For example, in certain situations, if RF power coupled to a process station of a multi-station fabrication chamber exceeds a threshold level, an anomalous plasma event (e.g., formation of an electric arc) may occur. In some instances, such an event may bring about formation of unwanted gaseous compounds, which may impede a semiconductor process. In some instances, an anomalous plasma event (e.g., formation of an electric arc) may damage a semiconductor wafer undergoing processing, which may necessitate inspection of the affected wafer outside of the process station. In certain other situations, if RF power coupled to a process station drops below a threshold level, plasma formation may be degraded or extinguished entirely. In some instances, extinguishing of an ionized plasma material may bring about an imbalance in deposition rates occurring at stations of a multi-station fabrication chamber. Consequently, at least in certain instances, responsive to the extinguishing of a plasma at a process station, the process station may be required to undergo plasma restarting operations. Such plasma restarting or re-initiation operations may delay fabrication processes (e.g., material deposition, material etch, and so forth).

In particular instances, accurate measurement the power of an RF signal coupled to a fabrication chamber may additionally impact operations conducted at other process stations of a multi-station fabrication chamber. For example, if power from an RF power generator is distributed among 2 or more process stations, an increase in RF power coupled to a first process station may bring about a corresponding reduction in power coupled to one or more other process stations. In some instances, in response to an increase in power coupled to a first station of a multi-station fabrication chamber, power to a second station of the fabrication chamber may fall below a threshold amount, which may cause plasma extinguishing in the second station. In such an instance, as previously alluded to, fabrication processes at the second station may consume longer periods of time, which may increase cost, decrease equipment availability for other processing operations, and/or decrease quality of a deposited film. In some instances, excessive occurrences of plasma extinguishing may bring about the need for additional processing and/or metrology to determine if quality of a fabricated wafer has been negatively impacted.

Particular implementations may represent improvements over alternative approaches of measuring or estimating power coupled from an RF signal utilized in plasma-assisted/plasma-enhanced fabrication processes. For example, in one or more of such alternative approaches, power of an RF signal may be estimated utilizing techniques that employ voltage division, peak detection, and/or use of buffer amplifiers. Consequently, especially with respect to the use of peak detection, such alternative approaches may give rise to inaccurate measurement of the current and voltage present in an RF signal. Such inaccuracies may distort the computing of the power of an RF signal which may, in turn, bring about unwarranted increases/decreases in power output of an RF signal generator. Such unwarranted increases/decreases in RF power coupled to stations of a multi-station fabrication chamber may bring about unwanted and/or unproductive variations in processes conducted at stations of the fabrication chamber. Such variations may affect the quality and cost of fabricated integrated circuit wafers, impede processing operations, and give rise to additional undesirable consequences. Certain embodiments herein do not employ voltage division, peak detection, and/or buffer amplifiers. Certain embodiments herein use the entire current and voltage signals (e.g., full wave signals) obtained from sensors conveying power, such as RF power, to a plasma reactor. In some cases, these signals are obtained in plasma reactors employing plasma generated by application of multiple radio frequencies.

Certain implementations may be utilized in conjunction with a number of wafer fabrication processes, such as various plasma-enhanced atomic layer deposition (ALD) processes, various plasma-enhanced chemical vapor deposition (CVD) processes, or may be utilized on-the-fly during single deposition processes. In certain implementations, an RF power generator having multiple output ports may be utilized at any signal frequency, such as at frequencies between about 300 kHz and about 60 MHz, which may include frequencies of about 400 kHz, about 1 MHz, about 2 MHz, about 13.56 MHz, and/or about 27.12 MHz. However, in other implementations, RF power generators having multiple output ports may operate at any signal frequency, which may include relatively low frequencies, such as between about 50 kHz and about 300 kHz, as well as higher signal frequencies, such as frequencies between about 60 MHz and about 100 MHz.

It should be noted that although particular implementations described herein may show and/or describe multi-station semiconductor fabrication chambers having 4 (four) process stations, implementations are intended to embrace multi-station integrated circuit fabrication chambers having or utilizing any number of process stations. Thus, in certain implementations, individual output ports of an RF power generator having multiple output ports may be assigned to a process station of a multi-station fabrication chamber having, for example, 2 process stations or 3 process stations. In other implementations individual output ports of an RF power generator having multiple output ports may be assigned to process stations of a multi-station integrated circuit fabrication chamber having a larger number of process stations, such as 5 process stations, 6 process stations, 8 process stations, 10 process stations, or any other number of process stations. Further, embodiments of the disclosure apply to chambers having only a single process station. Additionally, although particular implementations described herein may show and/or describe utilization of a single, relatively low frequency RF signal, such as a frequency of between about 300 kHz and about 2 MHz, as well as a single, relatively high-frequency RF signal, such as a frequency of between about 2 MHz and about 100 MHz, the disclosed implementations are intended to embrace the use of any number of frequencies below about 2 MHz as well as any number of frequencies above about 2 MHz.

Turning now to the figures, FIG. 1A shows a substrate processing apparatus 100 for depositing films on or over a semiconductor substrate utilizing any number of processes, according to various implementations. Processing apparatus 100 of FIG. 1A may employ a single process station 102 of a process chamber with a single substrate holder 108 (e.g., a pedestal) in an interior volume, which may be maintained under vacuum by vacuum pump 118. Showerhead 106 and gas delivery system 101, which may be fluidically coupled to the process chamber, may permit the delivery of film precursors, for example, as well as carrier and/or purge and/or process gases, secondary reactants, etc. Equipment utilized in the generation of plasma within the process chamber is also shown in FIG. 1A. The apparatus schematically illustrated in FIG. 1A may be adapted for performing, in particular, plasma-enhanced CVD.

In FIG. 1A, gas delivery system 101 includes a mixing vessel 104 for blending and/or conditioning process gases for delivery to showerhead 106. One or more mixing vessel inlet valves 120 may control introduction of process gases to mixing vessel 104. Particular reactants may be stored in liquid form prior to vaporization and subsequent delivery to process station 102 of a process chamber. The implementation of FIG. 1A includes a vaporization point 103 for vaporizing liquid reactant to be supplied to mixing vessel 104. In some implementations, vaporization point 103 may include a heated liquid injection module. In some other implementations, vaporization point 103 may include a heated vaporizer. In yet other implementations, vaporization point 103 may be eliminated from the process station. In some implementations, a liquid flow controller upstream of vaporization point 103 may be provided for controlling a mass flow of liquid for vaporization and delivery to process station 102.

Showerhead 106 may operate to distribute process gases and/or reactants (e.g., film precursors) toward substrate 112 at the process station, the flow of which may be controlled by one or more valves upstream from the showerhead (e.g., valves 120, 120A, 105). In the implementation depicted in FIG. 1A, substrate 112 is depicted as located beneath showerhead 106, and is shown resting on a pedestal 108. Showerhead 106 may include any suitable shape, and may include any suitable number and arrangement of ports for distributing process gases to substrate 112. In some implementations involving 2 or more stations, gas delivery system 101 includes valves or other flow control structures upstream from the showerhead, which can independently control the flow of process gases and/or reactants to each station so as to permit gas flow to one station while prohibiting gas flow to a second station. Furthermore, gas delivery system 101 may be configured to independently control process gases and/or reactants delivered to each station in a multi-station apparatus such that the gas composition provided to different stations is different; e.g., the partial pressure of a gas component may vary between stations at the same time.

In the implementation of FIG. 1A, gas volume 107 is depicted as being located beneath showerhead 106. In some implementations, pedestal 108 may be raised or lowered to expose substrate 112 to gas volume 107 and/or to vary the size of gas volume 107. Optionally, pedestal 108 may be lowered and/or raised during portions of the deposition process to modulate process pressure, reactant concentration, etc., within gas volume 107. Showerhead 106 and pedestal 108 are depicted as being electrically coupled to RF signal generator 114 and matching network 116 for coupling power to a plasma generator. Thus, showerhead 106 may function as an electrode for coupling radio frequency power into process station 102. In some implementations, the plasma energy is controlled (e.g., via a system controller having appropriate machine-readable instructions and/or control logic) by controlling one or more of a process station pressure, a gas concentration, power output of an RF signal generator, and so forth. For example, RF signal generator 114 and matching network 116 may be operated at any suitable RF power level, which may operate to form plasma having a desired composition of radical species. In addition, RF signal generator 114 may provide RF power having more than one frequency component, such as a low-frequency component (e.g., less than about 2 MHz) as well as a high frequency component (e.g., greater than about 2 MHz).

In some implementations, plasma ignition and maintenance conditions are controlled with appropriate hardware and/or appropriate machine-readable instructions in a system controller which may provide control instructions via a sequence of input/output control instructions. In one example, the instructions for bringing about ignition or maintaining a plasma are provided in the form of a plasma activation portion of a process recipe. In some cases, process recipes may be sequentially arranged, so that at least some instructions for the process can be executed concurrently. In some implementations, instructions for setting one or more plasma parameters may be included in a recipe preceding a plasma ignition process. For example, a first recipe may include instructions for setting a flow rate of an inert (e.g., helium) and/or a reactant gas, instructions for setting a plasma generator to a power set point and time delay instructions for the first recipe. A second, subsequent recipe may include instructions for enabling the plasma generator and time delay instructions for the second recipe. A third recipe may include instructions for disabling the plasma generator and time delay instructions for the third recipe. It will be appreciated that these recipes may be further subdivided and/or iterated in any suitable way within the scope of the present disclosure. In some deposition processes, a duration of a plasma strike may correspond to a duration of a few seconds, such as from about 3 seconds to about 15 seconds, or may involve longer durations, such as durations of up to about 30 seconds, for example. In certain implementations described herein, much shorter plasma strikes may be applied during a processing cycle. Such plasma strike durations may be on the order of less than about 50 milliseconds, with about 25 milliseconds being utilized in a specific example.

Figure 1B:
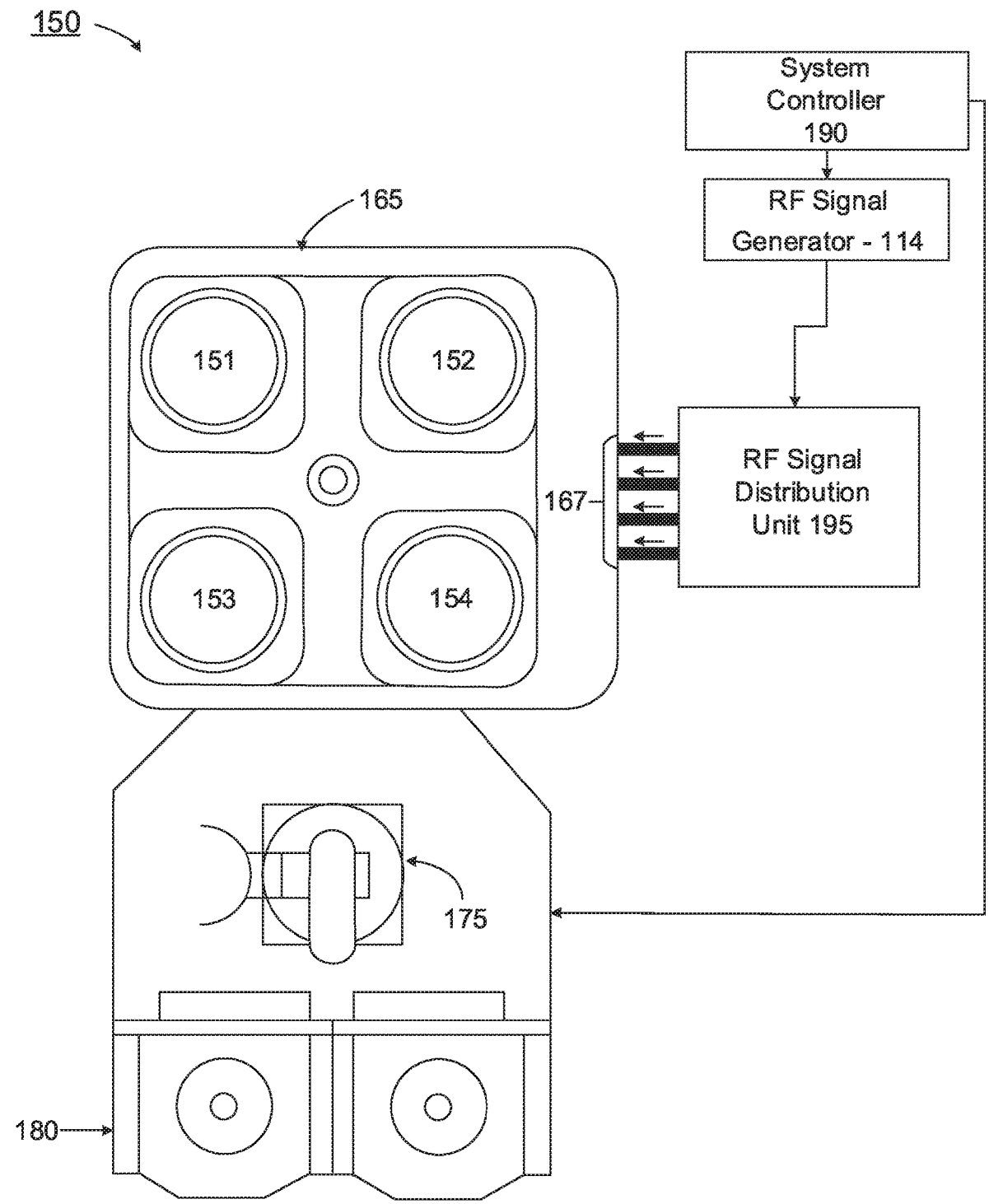
FIG. 1B depicts a schematic view of an implementation of a multi-station processing tool.

For simplicity, processing apparatus 100 is depicted in FIG. 1A as a standalone station (102) of a process chamber for maintaining a low-pressure environment. However, it may be appreciated that a plurality of process stations may be included in a multi-station processing tool environment, such as shown in FIG. 1B, which depicts a schematic view of an implementation of a multi-station processing tool. Processing tool 150 employs an integrated circuit fabrication chamber 165 that includes multiple fabrication process stations, each of which may be used to perform processing operations on a substrate held in a wafer holder, such as pedestal 108 of FIG. 1A, at a particular process station. In the implementation of FIG. 1B, the integrated circuit fabrication chamber 165 is shown as having four process stations 151, 152, 153, and 154. However, in certain other implementations, multi-station processing apparatuses may have more or fewer process stations depending on the implementation and, for instance, the desired level of parallel wafer processing, size/space constraints, cost constraints, etc. FIG. 1B additionally shows substrate handler robot 175, which may operate under the control of system controller 190, configured to move substrates from a wafer cassette (not shown in FIG. 1B) from loading port 180 and into multi-station integrated circuit fabrication chamber 165, and onto one of process stations 151, 152, 153, and 154.

FIG. 1B also depicts an implementation of a system controller 190 employed to control process conditions and hardware states of process tool 150. System controller 190 may include one or more memory devices, one or more mass storage devices, and one or more processors. The one or more processors may include a central processing unit, analog and/or digital input/output connections, stepper motor controller boards, etc. In some implementations, system controller 190 controls all of the activities of process tool 150. System controller 190 executes system control software stored in a mass storage device, which may be loaded into a memory device, and executed by a processor of the system controller. Software to be executed by a processor of system controller 190 may include instructions for controlling the timing, mixture of gases, fabrication chamber and/or station pressure, fabrication chamber and/or station temperature, wafer temperature, substrate pedestal, chuck and/or susceptor position, number of cycles performed on one or more substrates, and other parameters of a particular process performed by process tool 150. These programed processes may include various types of processes including, but not limited to, processes related to determining an amount of accumulation on a surface of the chamber interior, processes related to deposition of film on substrates including numbers of cycles, determining and obtaining a number of compensated cycles, and processes related to cleaning the chamber. System control software, which may be executed by one or more processors of system controller 190, may be configured in any suitable way. For example, various process tool component subroutines or control objects may be written to control operation of the process tool components necessary to carry out various tool processes.

In some implementations, software for execution by way of a processor of system controller 190 may include input/output control sequencing instructions for controlling the various parameters described above. For example, each phase of deposition and deposition cycling of a substrate may include one or more instructions for execution by system controller 190. The instructions for setting process conditions for an ALD/CFD deposition process phase may be included in a corresponding ALD/CFD deposition recipe phase. In some implementations, the recipe phases may be sequentially arranged, so that all instructions for a process phase are executed concurrently with that process phase.

Other computer software and/or programs stored on a mass storage device of system controller 190 and/or a memory device accessible to system controller 190 may be employed in some implementations. Examples of programs or sections of programs for this purpose include a substrate positioning program, a process gas control program, a pressure control program, a heater control program, and a plasma control program. A substrate positioning program may include program code for process tool components that are used to load the substrate onto pedestal 108 (of FIG. 1A) and to control the spacing between the substrate and other parts of process tool 150. A positioning program may include instructions for appropriately moving substrates in and out of the reaction chamber as necessary to deposit films on substrates and clean the chamber.

A process gas control program may include code for controlling gas composition and flow rates and for flowing gas into one or more process stations prior to deposition to bring about stabilization of the pressure in the process station. In some implementations, the process gas control program includes instructions for introducing gases during formation of a film on a substrate in the reaction chamber. This may include introducing gases for a different number of cycles for one or more substrates within a batch of substrates. A pressure control program may include code for controlling the pressure in the process station by regulating, for example, a throttle valve in the exhaust system of the process station, a gas flow into the process station, etc. The pressure control program may include instructions for maintaining the same pressure during the deposition of differing numbers of cycles on one or more substrates during the processing of the batch.

A heater control program may include code for controlling the current to heating unit 110 that is used to heat the substrate. Alternatively, the heater control program may control delivery of a heat transfer gas (such as helium) to the substrate.

In some implementations, there may be a user interface associated with system controller 190. The user interface may include a display screen, graphical software displays of the apparatus and/or process conditions, and user input devices such as pointing devices, keyboards, touch screens, microphones, etc.

In some implementations, parameters adjusted by system controller 190 may relate to process conditions. Non-limiting examples include process gas composition and flow rates, temperature, pressure, plasma conditions, etc. These parameters may be provided to the user in the form of a recipe, which may be entered utilizing the user interface. The recipe for an entire batch of substrates may include compensated cycle counts for one or more substrates within the batch in order to account for thickness trending over the course of processing the batch.

Signals for monitoring the process may be provided by analog and/or digital input connections of system controller 190 from various process tool sensors. The signals for controlling the process may be output by way of the analog and/or digital output connections of process tool 150. Non-limiting examples of process tool sensors that may be monitored include mass flow controllers, pressure sensors (such as manometers), thermocouples, etc. Sensors may also be included and used to monitor and determine the accumulation on one or more surfaces of the interior of the chamber and/or the thickness of a material layer on a substrate in the chamber. Appropriately programmed feedback and control algorithms may be used with data from these sensors to maintain process conditions.

System controller 190 may provide program instructions for implementing the above-described deposition processes. The program instructions may control a variety of process parameters, such as DC power level, pressure, temperature, number of cycles for a substrate, amount of accumulation on at least one surface of the chamber interior, etc. The instructions may control the parameters to operate in-situ deposition of film stacks according to various implementations described herein.

For example, the system controller may include control logic for performing the techniques described herein, such as determining an amount of accumulated deposition material currently on at least an interior region of the deposition chamber interior, applying the amount of accumulated deposition material determined in (a), or a parameter derived therefrom, to a relationship between (i) a number of ALD cycles required to achieve a target deposition thickness, and (ii) a variable representing an amount of accumulated deposition material, in order to obtain a compensated number of ALD cycles for producing the target deposition thickness given the amount of accumulated deposition material currently on the interior region of the deposition chamber interior, and performing the compensated number of ALD cycles on one or more substrates in the batch of substrates. The system may also include control logic for determining that the accumulation in the chamber has reached an accumulation limit and stopping the processing of the batch of substrates in response to that determination, and for causing a cleaning of the chamber interior.

In addition to the above-identified functions and/or operations performed by system controller 190 of FIG. 1B, the controller may additionally control and/or manage the operations of RF signal generator 114. RF signal generator 114 may provide an output signal, which may be conveyed to an RF signal distribution unit 195, which may divide the power of the input signal into, for example, 4 output signals. Output signals from RF signal distribution unit 195 may exhibit similar levels of RF voltage and RF current, which may be conveyed to multi-station integrated circuit fabrication chamber 165 via input ports 167. In certain implementations, as described further herein, operations controlled via system controller 190 may relate to determining upper and lower thresholds for RF signal power to be delivered to integrated circuit fabrication chamber 165, determining actual (such as real-time) levels of RF signal power delivered to integrated circuit fabrication chamber 165, RF signal power activation/deactivation times, RF signal on/off duration, duty cycle, operating frequency, and so forth. Additionally, system controller 190 may determine one or more normal operating parameters of RF power to be delivered to integrated circuit fabrication chamber 165 by way of input ports 167. Such parameters may include upper and lower thresholds of, for example, power reflected from one or more of input ports 167 in terms of a reflection coefficient (e.g., the scattering parameter $S_{11}$), voltage standing wave ratio, upper and lower thresholds of a voltage applied to one or more of input ports 167, upper and lower thresholds of current conducted through one or more of input ports 167, as well as an upper threshold for a magnitude of a phase angle between a voltage and a current conducted through input ports 167. Such thresholds may be utilized in defining "out-of-range" RF signal characteristics. For example, reflected power greater than an upper threshold may indicate an out-of-range RF power parameter. Likewise, an applied voltage or conducted current having a value below a lower threshold or greater than an upper threshold may indicate out-of-range RF signal characteristics. Similarly, a phase angle between an applied voltage and conducted current being greater than an upper threshold may indicate an out-of-range RF power parameter.

In particular implementations, multi-station integrated circuit fabrication chamber 165 may include input signal ports in addition to input ports 167 (additional input ports not shown in FIG. 1B). In particular implementations, process stations of integrated circuit fabrication chamber 165 may utilize first and second input ports in which a first input port may convey a signal having a first frequency and in which a second input port may convey a signal having a second frequency. Use of 2 or more frequencies may bring about enhanced plasma characteristics, which may give rise to deposition rates within particular limits and/or more easily controlled deposition rates. Use of 2 or more frequencies may bring about other desirable consequences. In certain implementations, frequencies of between about 300 kHz and about 100 MHz may be utilized. In some implementations, signal frequencies of about 2 MHz or less may be referred to as low frequency (LF) while frequencies greater than about 2 MHz may be referred to as high frequency (HF).

It may be appreciated that regardless of the frequencies of RF voltage and current signals coupled to multi-station integrated circuit fabrication chamber 165, it may be advantageous to measure such signals with an increased degree of accuracy. For example, for sinusoidal voltage and current signals that are in phase with each other, average RF power coupled to multi-station integrated circuit fabrication chamber 165 may be computed substantially in accordance with expression (1) below:

$$P_{avg} = \frac{1}{2} V_{peak} \times I_{peak} \quad (1)$$

Wherein $V_{peak}$ corresponds to a peak voltage signal, and wherein $I_{peak}$ corresponds to a peak current signal. However, it may be appreciated that power computed by way of expression (1), which specifies the use of peak RF voltage and peak RF current, may introduce inaccuracies since steady state or root mean square (RMS) levels of RF voltage and RF current may deviate significantly from peak values. For example, if RF voltage and current waveforms do not exhibit purely sinusoidal behavior, such that RF voltage and RF current achieve peak values for only a brief instant, computation of average RF power may overestimate actual power coupled to a fabrication chamber. Similarly, responsive to non-sinusoidal RF voltage and RF current waveforms reaching peak values for significant durations may result in underestimation of actual power coupled to a fabrication chamber. It may be appreciated that in both instances, such as overestimation or underestimation of RF power coupled to a fabrication chamber, any adjustments of parameters of RF signal generator 114 could potentially give rise to incorrect adjustment of RF signal generator output power parameters.

Accordingly, at least in particular implementations, it may be advantageous to formulate or compute power coupled to a fabrication chamber utilizing instantaneous levels of RF voltage applied by an RF signal and a current conducted by the RF signal. Such computations may more accurately represent levels of RF power coupled to a fabrication chamber which, in turn, may bring about tighter control, greater uniformity, greater repeatability, etc., as these pertain to fabrication processes performed via a fabrication chamber.

Figure 2:
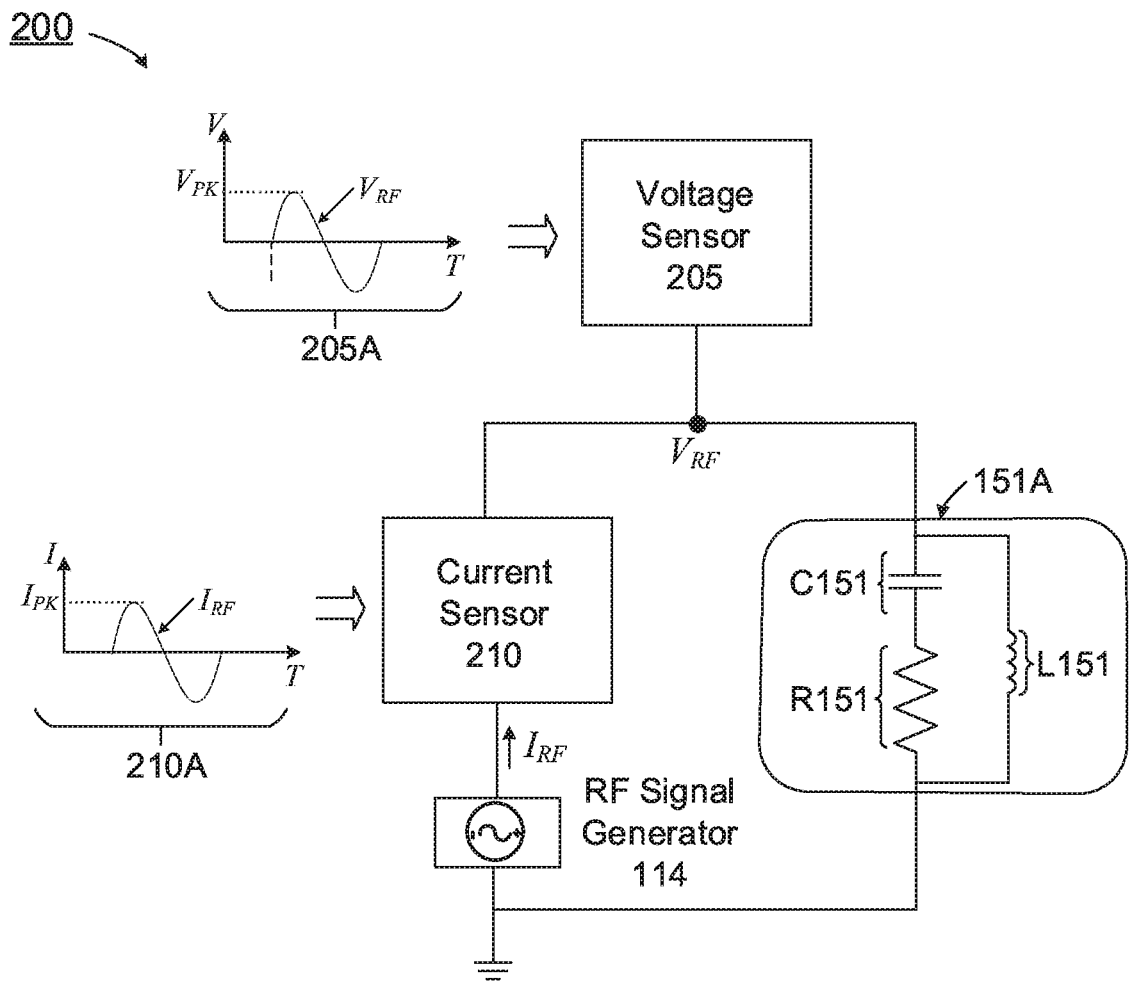
FIG. 2 is a schematic diagram showing a circuit involving a fabrication chamber as well as RF signal generation and measurement components, according to an implementation.

FIG. 2 is a schematic diagram showing a circuit involving a fabrication chamber as well as RF signal generation and measurement components, according to an implementation. Although FIG. 2 shows RF signal generator 114 providing a signal to a single process station 151, in other implementations, such as described in relation to FIG. 1B, RF signal generator 114 may provide a signal to RF signal distribution unit 195. In an implementations, RF signal distribution unit 195 unit is configured to divide power from a single RF input port to 2 or more output ports for coupling to input ports 167 of fabrication chamber 165 as shown in FIG. 2. To simplify the operations depicted in FIG. 2, additional components utilized in association with a fabrication chamber, such as power supplies, impedance matching units, RF power dividers, and so forth are omitted from FIG. 2.

In implementation 200, the complex impedance of a station, such as process station 151, of multi-station integrated circuit fabrication chamber 165 may be modeled and/or characterized by equivalent circuit 151A that includes a series and/or parallel lumped circuit having a capacitance C151 and a resistance R151. Capacitance C151 and resistance R151 are depicted as being in parallel with inductance L151. In some implementations, the complex impedance of a station of a multi-station integrated circuit fabrication chamber, as represented by equivalent circuit 151A may include a capacitance having a value of between about 1.5 nF and about 3.5 nF and may include a resistance of between about 5 ohms and about 10 ohms. In particular implementations, capacitor C151 may assume a value of about 2.0 nF and about 3.0 nF, and resistor R151 may assume a value of between about 6.5 ohms and about 8.5 ohms. However, the disclosed implementations are intended to embrace any real or complex impedance formed by series and/or parallel combinations of resistive and reactive circuit elements presented by a process station of an integrated circuit fabrication chamber. In certain implementations, a complex impedance presented by process station 151 of multi-station integrated circuit fabrication chamber 165 may be dependent upon one or more reactive gases and/or vapors present in the chamber, partial and total pressures of gases, and other factors. Thus, for certain pressure/gas combinations, chamber 165 may present a predominantly capacitive load while for other pressure/gas combinations, chamber 165 may present a predominantly inductive load, for example.

In the implementation of FIG. 2, voltage sensor 205 is coupled to a transmission line, such as a coaxial cable, for example, disposed between RF signal generator 114 and process station 151 of multi-station integrated circuit fabrication chamber 165 (as represented by equivalent circuit 151A). In particular implementations, voltage sensor 205 may correspond to a capacitive voltage sensor having a relatively high input impedance that occasionally or periodically samples a voltage at node $V_{RF}$ shown in FIG. 2 without consuming a significant electric current. The implementation of FIG. 2 also includes current sensor 210 (e.g., a inductive current transformer), which may be coupled in series between RF signal generator 114 and multi-station integrated circuit fabrication chamber 165 (as represented by equivalent circuit 151A). In particular implementations, current sensor 210 may correspond to an inductive current transformer having a relatively low input impedance that occasionally or periodically samples a current conducted from RF signal generator 114 without bringing about any significant voltage drop.

In particular implementations, voltage sensor 205 may include a voltage divider network, in which a voltage may be measured across a known lower resistance in comparison to a total resistance of known higher & lower resistor combination. In such a network, the actual voltage of the RF signal may be scaled by dividing the voltage measured across the known resistance by the sum of the 2 known resistances. In other instances, voltage sensor 205 may include a capacitive voltage divider. In such a network, the voltage of the RF signal may be scaled by dividing the voltage measured across a known capacitance in relation to the sum of the 2 known capacitances combined in series. In certain other implementations, RF signal parameter measurement may involve direct voltage sensing, in which voltage of an RF signal may be directly measured or sampled without (or exclusive of) a voltage divider network and/or without (or exclusive of) a capacitive voltage divider. Implementations may embrace alternative voltage measurement approaches other than those disclosed, which may result in measurement of voltage between RF signal generator 114 and equivalent circuit 151A.

In particular implementations, current sensor 210 may include a transformer coil coupled to a conductor conducting an RF current from an RF signal generator 114 to a process station. In such instances, a current conducted via a transmission line between RF signal generator 114 and a process station (e.g. process station 151) may be measured utilizing an inductive coil coupled to the transmission line. In such instances, a relatively small current may be induced in the inductive coil in relation to a current conducted through the transmission line. In such a sensor, the actual current conveyed by the RF signal may be scaled by considering the current measured in the inductive coil in relation to the coupling factor between current sensor 210 and the transmission line between RF signal generator 114 and a process station. Implementations may embrace alternative current measurement approaches other than those disclosed, which may result in measurement of voltage between RF signal generator 114 and a process station.

As shown in FIG. 2, a voltage at node $V_{RF}$ can be characterized as a conventional sinusoidal voltage or as a complex sinusoidal signal, having a peak amplitude indicated by $V_{PK}$ as depicted in graph 205A. Thus, in particular implementations, $V_{RF}$ may be characterized as a sinusoidal signal superimposed on a pulse train in which intermittently-pulsed sinusoidal RF signals are conveyed to a process station (e.g., process station 151). Alternatively, in certain other implementations, $V_{RF}$ may include a plurality of sinusoidal RF signals, such as signals having a first frequency superimposed on a pulse train, wherein a sinusoidal RF signal of a second frequency is superimposed on the sinusoidal RF signal of the first frequency. Accordingly, $V_{RF}$ of the implementation of FIG. 2 is intended to represent any number of composite waveforms having pulsed (e.g., relatively square-wave) components, saw-toothed (e.g., ramped) components, as well as any number of other components, and the disclosed implementations are not intended to be limited in this respect.

Similarly, graph 210A of FIG. 2 also depicts a sinusoidal electric current ($I_{RF}$) conducted through current sensor 210. As shown in graph 210A, an RF signal conveyed through current sensor 210 ($I_{RF}$) includes a peak current $I_{PK}$ having a period corresponding to a frequency of between, for example, about 300 kHz and about 100 MHz with an additional ±10% (for example) frequency fine-tuning capability. In certain other implementations, $I_{RF}$ may be characterized by a sinusoidal RF waveform having a first frequency superimposed on a pulse train, wherein a sinusoidal RF signal of a second frequency is superimposed on the sinusoidal RF signal of the first frequency. Accordingly, $I_{RF}$ of the implementation of FIG. 2 is intended to embrace any number of composite waveforms having pulsed (e.g., relatively square wave) components, saw-toothed (e.g., ramped) components, as well as any number of other components.

Figure 3:
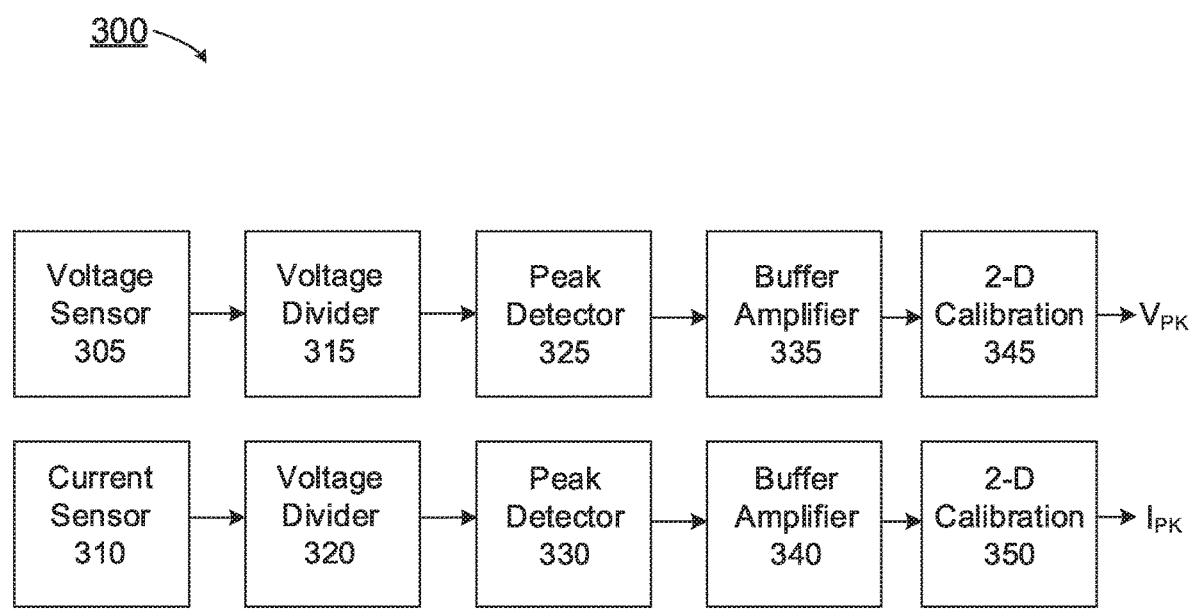
FIG. 3 is a diagram showing processes involved in measurement of RF signal current and voltage parameters, according to an implementation.

FIG. 3 is a diagram showing processes involved in measurement of RF signal current and voltage parameters, according to an implementation 300. In FIG. 3, voltage sensor 305 may include a voltage sensor disposed at a transmission line, such as a coaxial cable, which conveys a high-power RF signal between an RF signal generator and a process station of a multi-station integrated circuit fabrication chamber. As depicted in FIG. 3, voltage sensor 305 may interface with voltage divider 315, which may operate to make an output signal of voltage sensor 305 available to a peak detector, such as peak detector 325. An output signal of peak detector 325 may be conveyed to buffer amplifier 335, which may operate to provide a input high impedance so as not to distort an output signal from peak detector 325. Output signals from buffer amplifier 335 may be calibrated, such as via applying calibration coefficients stored by way of a lookup table, for example, by two-dimensional calibration circuit 345. In particular implementations, two-dimensional calibration circuit 345 includes frequency dependent coefficients that operate to adjust the levels of signals representing peak voltages provided by peak detector 325.

Similarly, current sensor 310 may include a current sensor disposed at a transmission line, such as a coaxial cable, which conveys a high-power RF signal between an RF signal generator and a process station of a multi-station integrated circuit fabrication chamber. As depicted in FIG. 3, current sensor 310 may interface with voltage divider 320, which may operate to make an output signal of voltage sensor 305 available to a peak detector, such as peak detector 330. An output signal of peak detector 330 may be conveyed to buffer amplifier 340, which may operate to provide a input high impedance so as not to distort an output signal from peak detector 330. Output signals from buffer amplifier 340 may be calibrated, such as via applying calibration coefficients stored by way of a lookup table, for example, by two-dimensional calibration circuit 350. In particular implementations, two-dimensional calibration circuit 350 includes frequency dependent coefficients that operate to adjust the levels of signals representing peak current levels provided by peak detector 330. Thus, in particular implementations, average RF power coupled to a station of multi-station integrated circuit fabrication chamber 165 may be computed substantially in accordance with expression (2) below:

$$P_{avg} = \frac{1}{2} V_{PK(CAL)} \times I_{PK(CAL)} \quad (2)$$

Wherein $V_{PK(CAL)}$ and $I_{PK(CAL)}$ correspond to calibrated output signals from two-dimensional calibration circuits 345 and 350, respectively.

Figure 4:
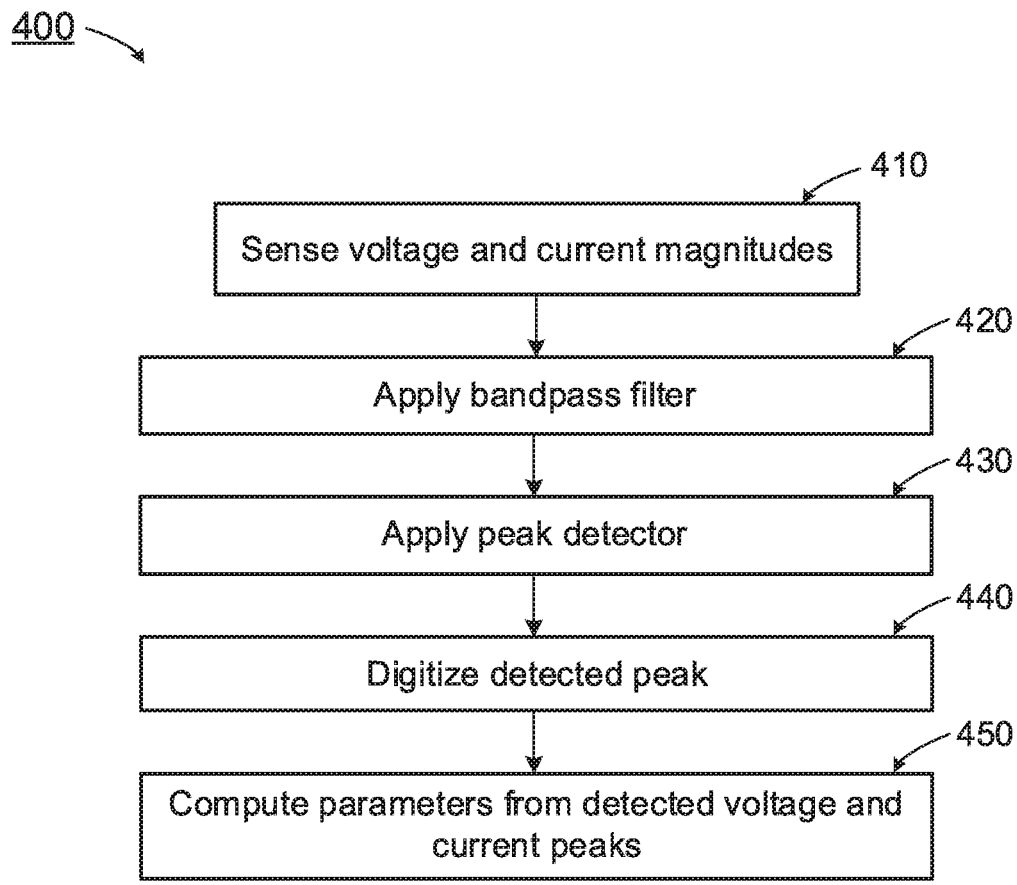
FIG. 4 is a flowchart for a method of measuring RF signal parameters, according to an implementation.
Figure 6:
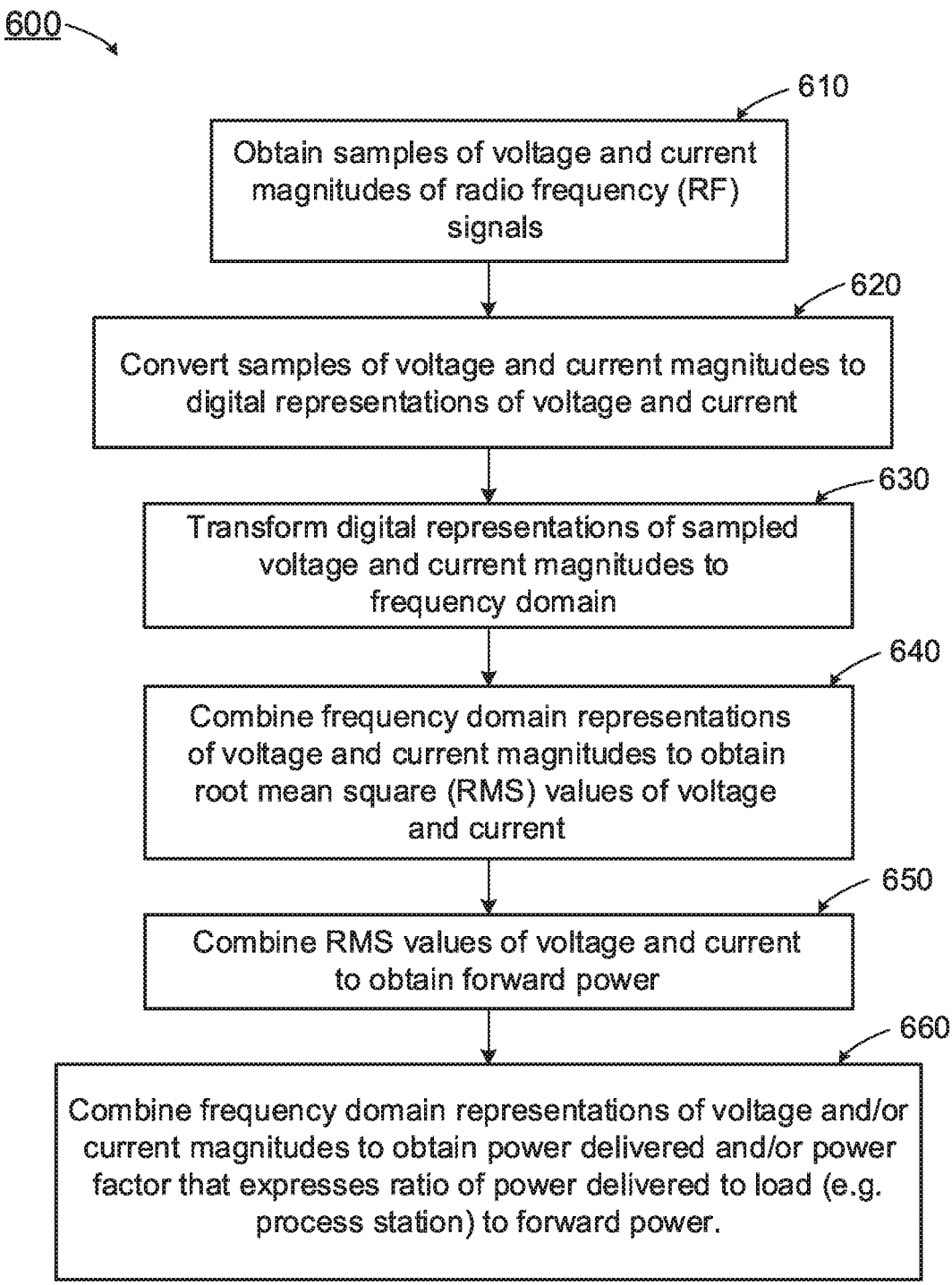
FIG. 6 is a flowchart for a method of measuring RF signal parameters in an integrated circuit fabrication chamber, according to an implementation.

FIG. 4 is a flowchart for a method of measuring RF signal parameters, according to an implementation 400. It should be noted that the disclosed implementations, such as those of FIG. 4 and FIG. 6, are intended to embrace variations of the respective figures, including methods that include actions in addition to those depicted in the figures, actions performed in an order different than those depicted in the figures, as well as methods including fewer steps than those depicted. The method of FIG. 4 begins at 410, which may include sensing of voltage and current magnitudes, such as by way of voltage sensor 305 and current sensor 310 as indicated in FIG. 3. The method of FIG. 4 may additionally include application of bandpass filter, such as at 420, which may operate to remove noise and/or out-of-band signals as well as other signal distortions in measured current and voltage magnitudes. At 430, a filtered voltage may be applied to a peak detector, which may employ a sample-and-hold technique to measure a peak voltage and/or a peak current of an RF signal conveyed from an RF signal generator to one or more stations of a multi-station integrated circuit fabrication chamber. At 440, and output of a peak detector may be measured and digitized. At 450, parameters from detected voltage and current peaks may be computed. In some instances, computing operations of 450 may include computing real and/or imaginary power conveyed in a signal from an RF signal generator as well as voltage and current values, phase relationships between voltage and current signals, and so forth.

It may be appreciated that, at least under particular circumstances, the apparatus and method of FIGS. 3 and 4 may apply to RF signals having frequencies within particular ranges. It may also be appreciated that particular processes referred to in FIGS. 3 and 4 may provide RF current and voltage measurements having at least some degree of accuracy when RF signal waveforms are at least approximately sinusoidal. Accordingly, if RF voltage and current measurements are performed utilizing waveforms that deviate significantly from sinusoidal waveforms, accuracy of voltage and current measurements may degrade. It may also be appreciated that, at least in particular instances, signal construction may be dependent upon the bandwidth of any analog-to-digital converters, which might be utilized at 440 of FIG. 4. Further, in response to noise signals being present in RF signal waveforms, accuracy of sensed voltages and currents may be negatively impacted.

Figure 5:
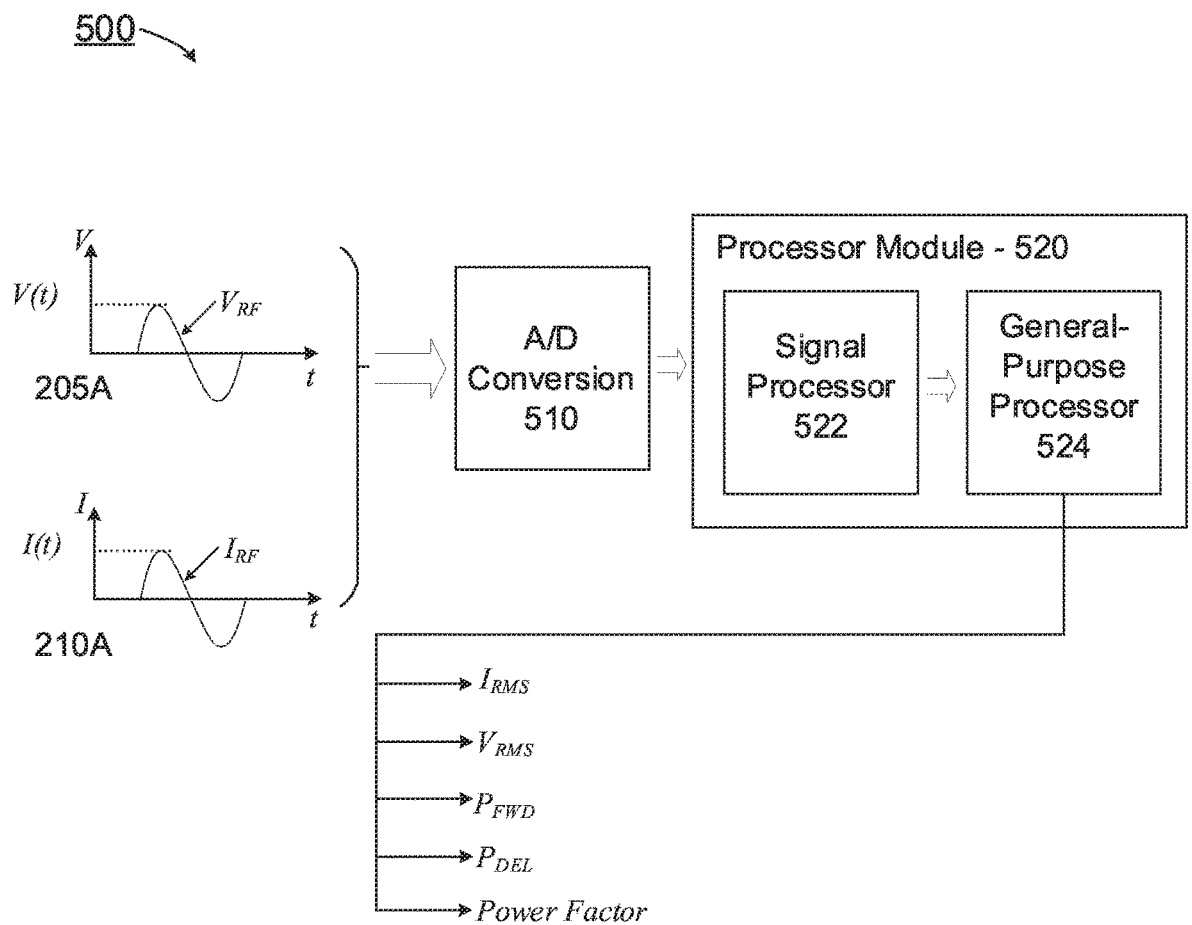
FIG. 5 is a schematic diagram of an apparatus adapted or configured to measure RF signal parameters, according to an implementation.

Thus, particular implementations of RF current and voltage measurements may represent an improvement over techniques identified utilizing the apparatus and method of FIGS. 3 and 4. Hence, FIG. 5, which avoids at least some of the drawbacks brought about by the apparatus and method of FIGS. 3 and 4, shows a schematic diagram of an apparatus adapted or configured to measure RF signal parameters, according to an implementation 500. In FIG. 5, waveforms corresponding to voltage of an RF signal as well as current conducted by an RF signal may be coupled to an analog-to-digital conversion module 510. In the implementation of FIG. 5, voltage and current waveforms may be represented by approximately sinusoidal waveforms (e.g., waveforms 205A and 210A), although the disclosed implementations are not limited to sinusoidal variations in RF voltage and current.

As depicted in FIG. 5, voltage and current waveforms 205A and 210A may be converted to digital representations, such as by way of analog-to-digital conversion module 510. In particular instances, analog-to-digital conversion module 510 may involve a successive-approximation technique to arrive at digital representations of analog voltages of an RF signal as well as digital representations of current conducted by an RF signal. In such instances, an input voltage or current signal is held steady by a sample-and-hold circuit while a flash analog-to-digital converter quantizes the sampled signal into a relatively small number of binary digits (e.g., 3 binary digits, 4 binary digits, 5 binary digits, etc.). The sampled binary digits are then coupled to a digital-to-analog converter, which may be accurate to, for example, 12 binary digits. An analog output signal from the digital-to-analog converter may then be subtracted from the input signal to the analog-to-digital converter. The difference between the analog output signal from the digital-to-analog converter and the input signal to the analog-to-digital converter, which may be considered a "residue," is amplified and coupled to a subsequent stage of the analog-to-digital converter, and the above-described process may be repeated. In such a successive-approximation architecture, the amplified residue is conveyed through successive stages of the converter, thereby providing small number of binary digits at each stage (e.g., 3 binary digits, 4 binary digits, 5 binary digits, etc.), until the residue reaches a subsequent flash analog-to-digital converter, which operates to resolve the least-significant binary digits.

It should be noted that although analog-to-digital conversion module 510 is shown as a single module, in some implementations, analog-to-digital conversion module 510 may include separate analog-to-digital modules, such as computing modules. For example, in some implementations, analog-to-digital conversion module 510 may include a first analog-to-digital module to perform conversion of an analog voltage waveform to a stream of instantaneous values of a digitized voltage. A second analog-to-digital module may perform conversion of an analog current waveform to a stream of instantaneous values of a digitized current.

Responsive to conversion of signals representing instantaneous voltages and instantaneous currents of signals from an RF signal generator, signals from analog-to-digital conversion module 510 can be conveyed to input ports of a processor module 520. Processor module 520 may include signal processor 522 and general-purpose processor 524, which may operate to transform the digital representations of the instantaneous voltage into frequency domain representations of a complex voltage corresponding to the RF signal voltage. Signal processor 522 may additionally operate to transform the digital representations of the instantaneous analog current into frequency domain representations of a complex current corresponding to the RF signal current. Accordingly, in a particular example, a purely sinusoidal waveform of voltage (V(t)) having a period of about 1 μs may be transformed, such as by signal processor 522, to a frequency domain representation having a corresponding single frequency of about 1 MHz. In at least certain implementations, off-the-shelf equipment may perform at least some of the functions performed by processor 520.

In particular implementations, frequency domain representations of complex voltage and complex current may be represented by a polar or phasor notation, in which a magnitude of the complex current and/or the complex voltage may be expressed in conjunction with a phase angle (e.g., phasor notation). In other implementations, frequency domain representations of complex voltage and complex current may be represented by a real component (e.g., real voltage) and an imaginary component (e.g., imaginary voltage). Thus, signal processor 522 of processor module 520 may operate to extract real and imaginary voltage ($V_{RF}$) components and/or to extract real and imaginary current components ($I_{RF}$) of an RF signal. In particular implementations, signal processor 522 is capable of extracting voltage and current waveforms (V(t) and (I(t)) such as of FIG. 2 to form complex voltage and complex current values, which may be represented as:

$$V(t) = V_{RE}(k) + jV_{IM}(k) \quad (2A)$$

$$I(t) = I_{RE}(k) + jI_{IM}(k) \quad (2B)$$

In which the quantities $V_{RE}(k)$ and $jV_{IM}(k)$ correspond to real and imaginary components that correspond to instantaneous values of voltage and current sampled utilizing signal processor 522. In expressions (2A) and (2B), k is a descriptor corresponding to a value sampled at a particular sampling interval. In particular implementations, signal processor 522 may perform a transform that corresponds to a Fast Fourier Transform (FFT). However, in alternative implementations, signal processor 522 may perform other types of mathematical operations, such as a Discrete Fourier Transform, for example.

In the implementation of FIG. 5, following transformation of instantaneous values of voltage and current waveforms into digitized representations of such waveforms, general-purpose processor 524 may obtain such digitized representations. In certain implementations, general-purpose processor may access a database, for example, which may store a lookup table to provide calibration coefficients for digitized representations of current and voltage as a function of frequency. In an example implementation, such calibration coefficients may relate to corrections expressed in terms of a scattering parameter (e.g. $S_{21}$), such as from a scattering matrix $$\begin{bmatrix} S_{11} & S_{12} \\ S_{21} & S_{22} \end{bmatrix},$$

which may characterize for frequency-dependent deviations from ideal scattering parameters. In another example implementation, calibration coefficients may relate to frequency-dependent corrections expressed in terms of conventions other than scattering parameters, such as parameters of the "transmission" or $$\begin{bmatrix} A & B \\ C & D \end{bmatrix}$$

matrix, a "hybrid" or $$\begin{bmatrix} g_{11} & g_{12} \\ g_{21} & g_{22} \end{bmatrix}$$

matrix, etc.

In particular implementations, general-purpose processor 524 may combine digitized representations corresponding to voltage and current signals generated by an RF signal source to form, for example, root mean square (RMS) voltage (V R ms) and RMS current (I R ms). In particular implementations, RMS current may be expressed as a summation of sampled values of real and imaginary current, obtained substantially in accordance with expression (3) below:

$$I_{RMS} = \sqrt{\sum_{i=0}^{\frac{k}{2}-1} (I_{Re}^2(i) + I_{Im}^2(i))} \quad (3)$$

Wherein $I_{Re}^2(i)$ and $I_{Im}^2(i)$ refer to values of instantaneously-sampled current, in which "k" samples may be obtained over a sampling period, such as 1 second. In particular implementations, RMS current may be expressed as a summation of sampled values of real and imaginary voltage, obtained substantially in accordance with expression (4), below:

$$V_{RMS} = \sqrt{\sum_{i=0}^{\frac{k}{2}-1} (V_{Re}^2(i) + V_{Im}^2(i))} \quad (4)$$

Wherein $V_{Re}^2(i)$ and $V_{Im}^2(i)$ refer to values of instantaneously-sampled voltage, in which "k" samples may be obtained over a sampling period, such as 1 second.

General-purpose processor 524 of FIG. 5 may be additionally be configured to combine digitized representations corresponding to voltage and current signals from an RF source to generate instantaneous values of RF power conveyed to a process station. In particular implementations, RF power may be computed substantially in accordance with expression (4), below:

$$P_{FWD} = I_{rms} * V_{rms} \quad (4)$$

General-purpose processor 524 of FIG. 5 may additionally be configured to determine actual power delivered, which may be computed via combining sampled values of real and imaginary voltage and currents in which "k" samples may be obtained over a sampling period, such as 1 second. Actual power delivered may be computed substantially in accordance with expression (5), below:

$$P_{DEL} = \sum_{i=0}^{\frac{k}{2}-1} (V_{RE}(i) * I_{RE}(i) + V_{IM}(i) * I_{IM}(i)) \quad (5)$$

Wherein the quantities $V_{RE}$ and $I_{RE}$ represent real voltage and current components (respectively) and wherein $V_{IM}$ and $I_{IM}$ represent imaginary voltage and current components (respectively). Further, computed forward and delivered power may be combined to compute a power factor, which refers to a ratio of power coupled to a load impedance (e.g., a process station of a multi-station fabrication chamber) versus power incident at the process station. Power factor at the process station, which may degrade responsive to incident power being reflected from the process station back to the RF signal generator, may be computed substantially in accordance with expression (6) below:

$$\text{Power Factor} = \frac{P_{DEL}}{P_{FWD}} \quad (6)$$

FIG. 6 is a flowchart for a method of measuring RF signal parameters in an integrated circuit fabrication chamber, according to an implementation. The method of FIG. 6 may be performed utilizing the apparatus of FIG. 5 described herein as well as utilizing voltage sensor 205 and current sensor 210 of FIG. 2. The method of FIG. 6 may begin at 610, which may include obtaining samples (e.g., analog samples) of magnitudes of current and voltage of RF signals. Such signals may include signal frequencies, for example, or may include a composite of 2 or more frequencies, such as frequencies between about 300 kHz and about 500 kHz, as well as frequencies in the megahertz range, such as frequencies of 13.56 MHz and/or about 27.12 MHz.

At 620, the obtained samples of voltage and current magnitudes may be converted to digital representations of voltage and current samples. In particular implementations, conversion operations of 620 may be performed by 2 separate (e.g., standalone) converters, which may operate as analog-to-digital converters. In certain implementations, a first analog-to-digital converter may digitize an output signal from a voltage sensor and a second analog-to-digital converter may digitize an output signal from a current sensor. In other implementations, analog-to-digital conversion operations at 620 may be performed by a single analog-to-digital conversion module, which may employ a time division multiplex approach in which a single analog-to-digital converter is utilized to digitize voltage magnitudes of both current and voltage.

The method of FIG. 6 may continue at 630, in which digital representations of sampled voltage and current magnitudes may be transformed to a frequency domain. In certain implementations, 630 may involve a use of a Fast Fourier Transform. In certain other implementations, 630 may involve use of a different transform, such as a Discrete Fourier Transform, for example. The method may continue at 640, which may involve combining frequency domain representations of current and voltage magnitudes to obtain RMS values of voltage and current. In some instances, combining of frequency domain representations of voltage and current magnitudes may involve computing such magnitudes substantially in accordance with expressions (3) and (4) to obtain $I_{RMS}$ is and $V_{RMS}$, described hereinabove.

The method may continue at 650, in which RMS values of voltage and current may be combined, such as substantially in accordance with expression (5) described hereinabove, to obtain forward power ($P_{FWD}$). The method may continue at 660, in which frequency domain representations of voltage and/or current magnitudes may be combined to obtain power delivered and/or a power factor that expresses a ratio of power delivered to a load (such as a process station) with respect to forward power. Computation of power factor may be conducted substantially in accordance with expression (6), described hereinabove.

More generally, in many instances, manufacture of semiconductor devices can involve depositing or etching of one or more thin films on or over a planar or non-planar substrate in an integrated fabrication process. In some aspects of an integrated process, it may be useful to deposit thin films that conform to unique substrate topography. As previously mentioned herein, one type of reaction that is useful in many instances may involve chemical vapor deposition (CVD). In typical CVD processes, gas phase reactants introduced into stations of a reaction chamber simultaneously undergo a gas-phase reaction. The products of the gas-phase reaction deposit on the surface of the substrate. Also as previously described, a reaction of this type may be driven by, or enhanced by, presence of a plasma, in which case the process may be referred to as a plasma-enhanced chemical vapor deposition (PECVD) reaction. As used herein, the term CVD is intended to include PECVD unless otherwise indicated. CVD processes have certain characteristics that render them less appropriate in some contexts. For instance, mass transport limitations of CVD gas phase reactions may bring about deposition effects that exhibit thicker deposition at top surfaces (e.g., top surfaces of gate stacks) and thinner deposition at recessed surfaces (e.g., bottom corners of gate stacks). Further, in response to some semiconductor die having regions of differing device density, mass transport effects across the substrate surface may result in within-die and within-wafer thickness variations. Thus, during subsequent etching processes, thickness variations can result in over-etching of some regions and under-etching of other regions, which can degrade device performance and die yield. Another difficulty related to CVD processes is that such processes are often unable to deposit conformal films in high aspect ratio features. This issue can be increasingly problematic as device dimensions continue to shrink.

In another example, some deposition processes involve multiple film deposition cycles, each producing a discrete film thickness. For example, in ALD, thickness of a deposited layer may be limited by an amount of one or more film precursor reactants, which may adsorb onto a substrate surface, so as to form an adsorption-limited layer, prior to the film-forming chemical reaction itself. Thus, a feature of ALD involves the formation of thin layers of film, such as layers having a width of a single atom or molecule, which are used in a repeating and sequential matter. As device and feature sizes continue to be reduced in scale, and as three-dimensional devices and structures become more prevalent in integrated circuit (IC) design, the capability of depositing thin conformal films (e.g., films of material having a uniform thickness relative to the shape of the underlying structure) continues to gain in importance. Thus, in view of ALD being a film-forming technique in which each deposition cycle operates to deposit a single atomic or molecular layer of material, ALD may be well suited to the deposition of conformal films. Typical device fabrication processes involving ALD may include multiple ALD cycles, which may number into the hundreds or thousands, may then be utilized to form films of virtually any desired thickness. Further, in view of each layer being thin and conformal, a film that results from such a process may conform to a shape of any underlying device structure. In certain implementations, an ALD cycle may include the following steps:

Exposure of the substrate surface to a first precursor.
Purge of the reaction chamber in which the substrate is located.

Activation of a reaction of the substrate surface, typically with a plasma and/or a second precursor.

Purge of the reaction chamber in which the substrate is located.

The duration of each ALD cycle may typically be less than about 25 seconds or less than about 10 seconds or less than about 5 seconds. The plasma exposure step (or steps) of the ALD cycle may be of a short duration, such as a duration of about 1 second or less.

In particular implementations, ALD operations may be controlled and/or managed by system controller 190 (of FIG. 1B), which may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus, as described above, the controller may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

In the foregoing detailed description, numerous specific details are set forth to provide a thorough understanding of the presented embodiments or implementations. The disclosed embodiments or implementations may be practiced without some or all of these specific details. In other instances, well-known process operations have not been described in detail so as to not unnecessarily obscure the disclosed embodiments or implementations. While the disclosed embodiments or implementations are described in conjunction with the specific embodiments or implementations, it will be understood that such description is not intended to limit the disclosed embodiments or implementations.

The detailed description is directed to certain embodiments or implementations for the purposes of describing the disclosed aspects. However, the teachings herein can be applied and implemented in a multitude of different ways. In the foregoing detailed description, references are made to the accompanying drawings. Although the disclosed embodiments or implementation are described in sufficient detail to enable one skilled in the art to practice the embodiments or implementation, it is to be understood that these examples are not limiting; other embodiments or implementation may be used and changes may be made to the disclosed embodiments or implementation without departing from their spirit and scope. Additionally, it should be understood that the conjunction "or" is intended herein in the inclusive sense where appropriate unless otherwise indicated; for example, the phrase "A, B, or C" is intended to include the possibilities of "A," "B," "C," "A and B," "B and C," "A and C," and "A, B, and C."

In this application, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication thereon. A wafer or substrate used in the semiconductor device industry typically includes a diameter of 200 mm, or 300 mm, or 450 mm. The foregoing detailed description assumes embodiments or implementations are implemented on a wafer, or in connection with processes associated with forming or fabricating a wafer. However, the disclosed implementations are not so limited. The work piece may be of various shapes, sizes, and materials. In addition to semiconductor wafers, other work pieces that may take advantage of the disclosed implementations and may include various articles such as printed circuit boards, or the fabrication of printed circuit boards, and the like.

Unless the context of this disclosure clearly requires otherwise, throughout the claims, the words "comprise," "comprising," and the like are to be construed in an inclusive sense as opposed to an exclusive or exhaustive sense; that is to say, in a sense of "including, but not limited to." Words using the singular or plural number also generally include the plural or singular number respectively. When the word "or" is used in reference to a list of 2 or more items, that word covers all of the following interpretations of the word: any of the items in the list, all of the items in the list, and any combination of the items in the list. The term "implementation" refers to implementations of techniques and methods described herein, as well as to physical objects that embody the structures and/or incorporate the techniques and/or methods described herein.

What is claimed is:

1. An apparatus to estimate parameters of a radio frequency (RF) signal coupled to an integrated circuit fabrication chamber, comprising:

a voltage sensor configured to provide an indication of a voltage of the RF signal;

a current sensor configured to provide an indication of a current conducted by the RF signal;

an analog-to-digital conversion module coupled to an output port of the voltage sensor and to an output port of the current sensor, the analog-to-digital converter configured to provide digital representations of an instantaneous voltage and an instantaneous current of the RF signal; and one or more processors configured to transform the digital representations of the instantaneous voltage and the digital representations of the instantaneous current into frequency domain representations of a complex voltage corresponding to the RF signal voltage and into frequency domain representations of a complex current corresponding to the RF signal current, the one or more processors additionally configured to combine frequency domain representations of the complex voltage and the complex current to form root mean square (RMS) voltage and RMS current, wherein the frequency domain representations of the complex voltage and the frequency domain representations of the complex current each include a plurality of samples.

2. The apparatus of claim 1, wherein at least one of the one or more processors is configured to perform a Fast Fourier Transform (FFT) of the digital representation of the instantaneous voltage of the RF signal and of the instantaneous current of the RF signal.

3. The apparatus of claim 1, wherein the voltage sensor comprises a capacitive voltage sensor.

4. The apparatus of claim 1, wherein the current sensor comprises an inductive current transformer.

5. The apparatus of claim 1, wherein the analog-to-digital conversion module is configured to apply a successive-approximation technique.

6. The apparatus of claim 1, wherein the RF signal is provided by an RF power generator that provides at least 2 frequency components.

7. The apparatus of claim 6, wherein the at least 2 frequency components comprise a first frequency of about 400 kHz and a second frequency of about 13.56 MHz.

8. The apparatus of claim 1, wherein the one or more processors are additionally configured to apply one or more calibration coefficients to the frequency domain representations of the complex voltage and to apply one or more calibration coefficients to the frequency domain representations of the complex current, wherein the one or more calibration coefficients represent frequency-dependent deviations from ideal scattering parameters.

9. The apparatus of claim 1, wherein the apparatus is exclusive of a voltage divider.

10. The apparatus of claim 1, wherein the apparatus is exclusive of a peak detector.

11. The apparatus of claim 1, wherein the apparatus is exclusive of a buffer amplifier.

12. The apparatus of claim 1, wherein the frequency domain representations of the complex voltage and the complex current are combined to obtain actual power delivered to a process station.

13. The apparatus of claim 12, wherein the frequency domain representations of the complex voltage and the complex current are combined to obtain power factor at the process station.

14. An apparatus adapted to estimate radio frequency (RF) power coupled to a station of an integrated circuit fabrication chamber, comprising:
a voltage sensor configured to provide an indication of a voltage of the RF signal;
a current sensor configured to provide an indication of the current conducted by the RF signal;
an analog-to-digital conversion module coupled to an output port of the voltage sensor and to an output port of the current sensor, the analog-to-digital converter configured to provide digital representations of an instantaneous voltage and an instantaneous current of the RF signal; and
one or more processors configured to:
obtain the digital representations of the instantaneous voltage of the RF signal and the digital representations of the instantaneous current conducted by the RF signal;
transform the obtained digital representations of the instantaneous voltage of the RF signal and the instantaneous current of the RF signal into a frequency domain representation of a complex voltage corresponding to the voltage of the RF signal and into a frequency domain representation of a complex current corresponding to the current conducted by the RF signal; and
combine the complex voltage of the RF signal and the complex current of the RF signal to form root mean square (RMS) voltage and RMS current, wherein the frequency domain representation of the complex voltage and the frequency domain representation of the complex current each include a plurality of samples.

15. The apparatus of claim 14, wherein the one or more processors is configured to transform the obtained digital representations of the instantaneous voltage of the RF signal and the instantaneous current conducted by the RF signal utilizing a Fast Fourier Transform.

16. The apparatus of claim 14 wherein the one or more processors is additionally configured to apply one or more calibration coefficients to the complex voltage of the RF signal and the complex current conducted by the RF signal, wherein the one or more calibration coefficients represent frequency-dependent deviations from ideal scattering parameters.

17. The apparatus of claim 14, wherein the one or more processors is additionally configured to utilize the complex voltage of the RF signal and the complex current of the RF signal to obtain power delivered to a station of the integrated circuit fabrication chamber.

18. The apparatus of claim 17, wherein the one or more processors is additionally configured to utilize the complex voltage of the RF signal and the complex current of the RF signal to obtain a ratio of power delivered to forward power at the station of the integrated circuit fabrication chamber.

19. The apparatus of claim 14, wherein the apparatus is exclusive of a buffer amplifier.

* * * * *